United States Patent
Hata et al.

(10) Patent No.: US 6,969,873 B2
(45) Date of Patent: Nov. 29, 2005

(54) NITRIDE GALLIUM COMPOUND SEMICONDUCTOR LIGHT EMISSION DEVICE

(75) Inventors: Toshio Hata, Nara (JP); Kensaku Yamamoto, Tenri (JP); Taiji Morimoto, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/775,838

(22) Filed: Feb. 1, 2001

(65) Prior Publication Data

US 2001/0042860 A1 Nov. 22, 2001

(30) Foreign Application Priority Data

Feb. 3, 2000 (JP) .............................. 2000-025920

(51) Int. Cl.[7] .......................................... H01L 29/22
(52) U.S. Cl. .......................................... 257/94; 257/99
(58) Field of Search ................... 257/21, 59, 79–103, 257/72, 13–15; 438/22, 24

(56) References Cited

U.S. PATENT DOCUMENTS

| | | | | |
|---|---|---|---|---|
| 3,783,353 A | * | 1/1974 | Pankove ...................... | 257/76 |
| 4,707,216 A | * | 11/1987 | Morkoc et al. ............. | 117/105 |
| 5,200,668 A | * | 4/1993 | Ohashi et al. ............. | 313/498 |
| 5,309,001 A | * | 5/1994 | Watanabe et al. ............. | 257/99 |
| 5,369,289 A | * | 11/1994 | Tamaki et al. ................ | 257/99 |
| 5,393,993 A | * | 2/1995 | Edmond et al. .............. | 257/77 |
| 5,739,554 A | * | 4/1998 | Edmond et al. ............ | 257/103 |
| 5,789,768 A | * | 8/1998 | Lee et al. ...................... | 257/96 |
| 5,977,565 A | * | 11/1999 | Ishikawa et al. ............... | 257/81 |
| 5,990,500 A | * | 11/1999 | Okazaki ....................... | 257/99 |
| 6,040,588 A | * | 3/2000 | Koide et al. ................... | 257/15 |
| 6,078,064 A | * | 6/2000 | Ming-Jiunn et al. ........ | 257/103 |
| 6,130,446 A | * | 10/2000 | Takeuchi et al. ............... | 257/99 |
| 6,146,916 A | * | 11/2000 | Nanishi et al. ............... | 438/46 |
| 6,160,446 A | * | 12/2000 | Azimi et al. ................... | 257/99 |
| 6,172,382 B1 | * | 1/2001 | Nagahama et al. ........... | 257/94 |
| 6,191,436 B1 | * | 2/2001 | Shibata et al. ................ | 257/91 |
| 6,221,684 B1 | * | 4/2001 | Sugawara et al. ............ | 438/47 |
| 6,242,761 B1 | * | 6/2001 | Fujimoto et al. ............. | 257/94 |
| 6,268,618 B1 | * | 7/2001 | Miki et al. ..................... | 257/99 |
| 6,377,596 B1 | * | 4/2002 | Tanaka et al. ................ | 372/45 |
| 6,380,564 B1 | * | 4/2002 | Chen et al. ................... | 257/99 |
| 6,410,944 B1 | * | 6/2002 | Song ............................. | 257/99 |
| 6,414,339 B1 | * | 7/2002 | Tsutsui ......................... | 257/99 |
| 6,541,797 B1 | * | 4/2003 | Udagawa ...................... | 257/94 |
| 6,542,526 B1 | * | 4/2003 | Niwa et al. .................... | 372/45 |

FOREIGN PATENT DOCUMENTS

JP 10-163531 6/1998

* cited by examiner

*Primary Examiner*—Long Pham
*Assistant Examiner*—Thao X. Le
(74) *Attorney, Agent, or Firm*—Morrison & Foerster LLP

(57) ABSTRACT

A gallium nitride compound semiconductor light emission device includes: a substrate; an n-type electrode region comprising an n-type transmissive electrode; a gallium nitride compound semiconductor multilayer structure including an active layer; and a p-type electrode region comprising a p-type transmissive electrode. The p-type transmissive electrode and the n-type transmissive electrode transmit light which is generated in the active layer and reflected from the substrate so that the light exits the light emission device.

13 Claims, 13 Drawing Sheets

3000

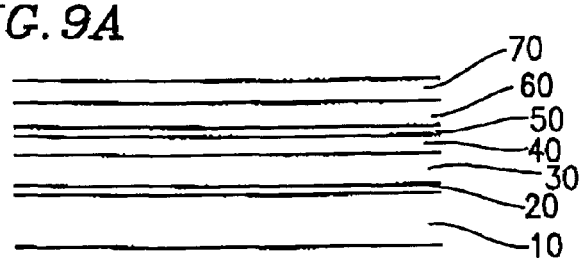
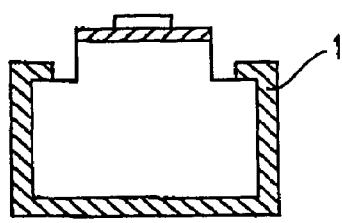
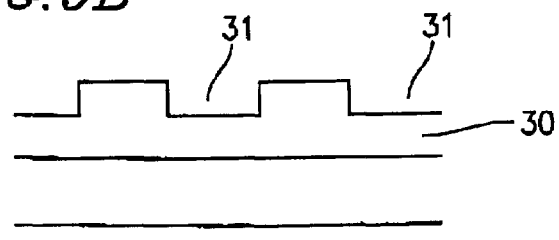
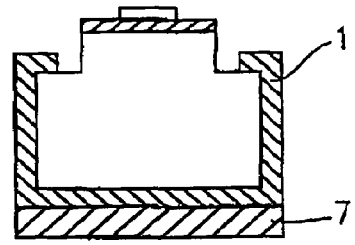
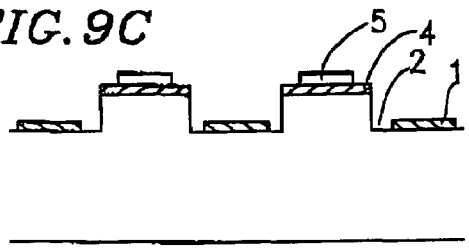

6000

NITRIDE GALLIUM COMPOUND SEMICONDUCTOR LIGHT EMISSION DEVICE

BACKGROUND OF THE INVENTION

1. Field of the Invention

The present invention relates to a gallium nitride compound semiconductor which emits light in regions ranging from the visible spectrum to the ultraviolet range. In particular, the present invention relates to an electrode structure for a gallium nitride compound semiconductor light emission device having an excellent external emission efficiency.

2. Description of the Related Art

FIG. 13 is a plan view illustrating an exemplary structure of a conventional light emission device. As shown in FIG. 13, a p-type electrode 400 and an n-type electrode 100 for wire bonding are disposed in a diagonal arrangement. A peripheral electrode 200 is coupled to the n-type electrode 100, whereas a transparent electrode 300 is coupled to the p-type electrode 400. Among other structures, Japanese Laid-Open Patent Publication No. 10-163531 discloses a gallium nitride compound semiconductor light emission device structure such that the peripheral electrode 200 is provided at an outer periphery of a square-shaped light emission device, whereas the transparent electrode 300 is provided within an area surrounded by the peripheral electrode 200.

Generally, a component of light which is emitted by an active layer of a light emission device travels toward a substrate within the device, so as to be reflected therefrom and exit the device. In accordance with the aforementioned conventional light emission device, the n-electrode 100, which is formed in a peripheral portion of the face on which the p-type electrode 400 is provided (i.e., the face through which light is allowed to exit the light emission device), acts to shield the light reflected by the substrate from exiting the device. This results in a decrease in the amount of light which is generated by the light emission device, i.e., a decrease in the total light output power obtained from the light emission device.

SUMMARY OF THE INVENTION

A gallium nitride compound semiconductor light emission device according to the present invention includes: a substrate; an n-type electrode region comprising an n-type transmissive electrode; a gallium nitride compound semiconductor multilayer structure including an active layer; and a p-type electrode region comprising a p-type transmissive electrode, wherein the n-type transmissive electrode is of a type which is substantially transparent.

In one embodiment of the invention, the p-type transmissive electrode and the n-type transmissive electrode transmit light which is generated in the active layer and reflected from the substrate so that the light exits the light emission device.

In another embodiment of the invention, the n-type transmissive electrode is located outside of the p-type transmissive electrode.

In still another embodiment of the invention, the n-type transmissive electrode is formed around a circumference of the p-type transmissive electrode.

In still another embodiment of the invention, the gallium nitride compound semiconductor multilayer structure includes a buffer layer and an n-type gallium nitride compound semiconductor layer, and the n-type transmissive electrode is formed on a side face of the substrate, a side face of the buffer layer, and a side face of the n-type gallium nitride compound semiconductor layer in a region neighboring the buffer layer.

In still another embodiment of the invention, the n-type electrode region further comprises an n-type pad electrode, and the p-type electrode region further comprises a p-type pad electrode.

In still another embodiment of the invention, the n-type pad electrode and the p-type pad electrode are provided substantially along one side of a light emitting face of the gallium nitride compound semiconductor light emission device.

In still another embodiment of the invention, the p-type pad electrode is formed in the vicinity of a center of a light emitting face of the gallium nitride compound semiconductor light emission device.

In still another embodiment of the invention, the n-type transmissive electrode comprises at least one of a thin metal film and an oxide semiconductor.

In still another embodiment of the invention, the n-type pad electrode is of a type which realizes a Schottky contact.

In still another embodiment of the invention, the n-type pad electrode comprises at least one material selected from the group consisting of: Pd/Au, Ni/Au, Pt/Au, Pd/Ni/Au, Pd/Al, Ni/Al, Pt/Al, Pd/Ni/Al, Pd/oxide semiconductor, Ni/oxide semiconductor, Pt/oxide semiconductor, and Pd/Ni/oxide semiconductor; or an alloy comprising one or more materials selected from the above group.

Thus, a light emission device according to the present invention includes an n-type electrode formed in a peripheral portion of a face on which a p-type electrode is provided, such that the n-type electrode is of a type which is substantially transparent with respect to light emitted from the light emission device. (Hereinafter, such an electrode may be referred to as a "transmissive electrode"). Accordingly, the emitted light which has been reflected from the substrate passes through the n-type electrode, which is substantially transparent with respect to the emitted light, so as to exit the device. As a result, the light emission device according to the present invention can have an improved external emission efficiency.

The n-type electrode may attain substantial transparency with respect to the emitted light by being composed of a thin metal film, or of a conductive oxide semiconductor layer which is substantially transparent with respect to the emitted light. Preferably, the conductive oxide semiconductor has a high transmittance in regions ranging from the visible spectrum to the ultraviolet range. Examples of such oxide semiconductors include, without limitation, ITO (indium tin oxide) materials, CTO (cadmium-doped tin oxide) materials, and AZO (aluminum-doped zinc oxide) materials.

The n-type electrode, which is formed in a peripheral portion of the face on which a p-type electrode is provided, may be a thin metal film, an oxide semiconductor layer of any of the aforementioned types or any other type, or a multilayer structure including the same.

The substrate may be a conductive substrate (e.g., GaN, SiC, Si, GaAs, or Gap) or a non-conductive substrate (e.g., sapphire).

The width of the n-type electrode to be formed on the face on which a p-type electrode is provided, i.e., the upper face or light exiting surface of an n-type gallium nitride compound semiconductor, is preferably in the range from about 5 μm to about 100 μm. If the width is smaller than about 5 μm, It may be difficult to form the n-type electrode. If the width is greater than about 100 μm, the emitted light may again be reduced due to the excessive electrode area. A large electrode area is also detrimental to productivity because a large area is occupied by one chip.

Throughout the present specification, when an n-type electrode is said to be "formed in a peripheral portion of a face on which a p-type electrode is provided", it is meant that the n-type electrode is provided generally on an upper face of a light emission device if, for example, the p-type is provided on the upper face of the light emission device. However, it is not intended that the n-type electrode and the p-type electrode must be in plane or flush with each other. Rather, it is intended that the n-type electrode and the p-type electrode may be staggered, i.e., situated at different levels generally belonging to the same "face" of the light emission device, as is best depicted in FIG. 4, for example.

Thus, the invention described herein mares possible the advantage of providing a light emission device including an n-type electrode formed in a peripheral portion of a face on which a p-type electrode is provided, wherein the n-type electrode is of a type which is substantially transparent with respect to light emitted from the light emission device, so that the light emitted from the light emission device is not substantially shielded by the n-type electrode.

This and other advantages of the present invention will become apparent to those skilled in the art upon reading and understanding the following detailed description with reference to the accompanying figures.

BRIEF DESCRIPTION OF THE DRAWINGS

FIGS. 9A to 9E are schematic cross-sectional views respectively illustrating the GaN compound semiconductor light emission device 3000 according to Example 3 of the present invention, at various steps of a production process therefor.

DESCRIPTION OF THE PREFERRED EMBODIMENTS

Hereinafter, the present invention will be specifically described by way of illustrative examples, with reference to the accompanying figures. As used herein, a "gallium nitride compound semiconductor", (or "GaN compound semiconductor") is intended to encompass $In_xAl_yGa_{1-x-y}N$ ($0 \leq x$, $0 \leq y$, $x+y \leq 1$), for example.

EXAMPLE 1

Figure 1:
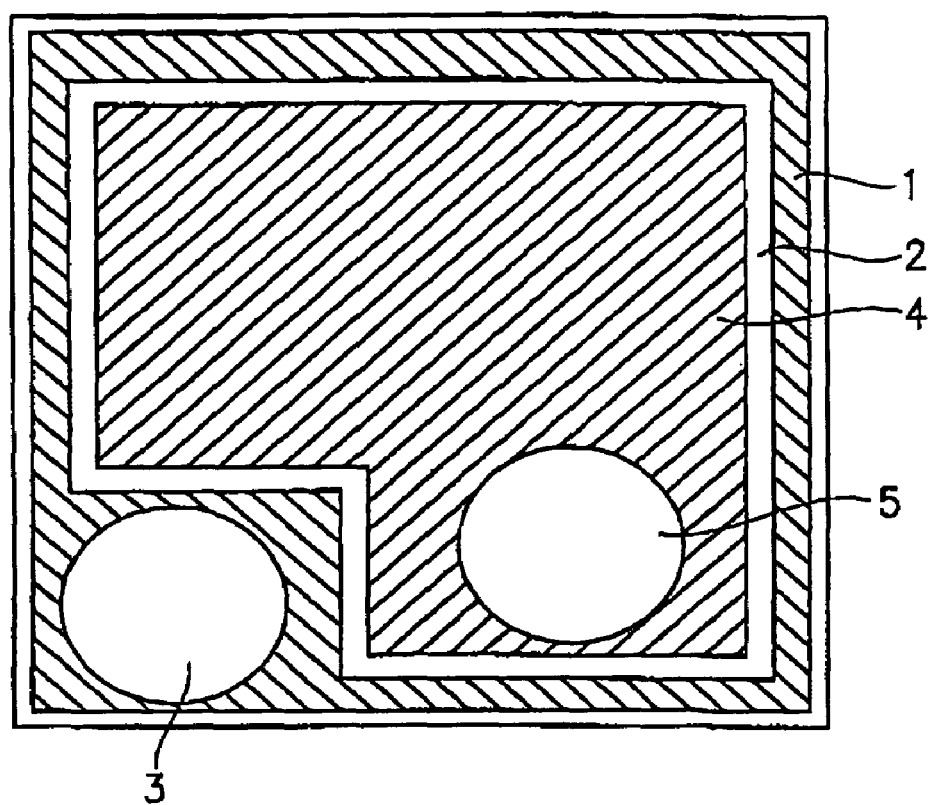
FIG. 1 is a schematic plan view illustrating a GaN compound semiconductor light emission device 1000 according to Example 1 of the present invention.

FIG. 1 is a schematic plan view illustrating a light emission device 1000 according to Example 1 of the present invention. The light emission device 1000 includes a GaN compound semiconductor multilayer structure including at least a light emission layer (active layer). The GaN compound semiconductor multilayer structure generally includes p-type GaN compound semiconductor layers and n-type GaN compound semiconductor layers. Upon one of the p-type GaN compound semiconductor layers, a p-type transmissive electrode 4 and a p-type pad electrode 5 are formed (the p-type transmissive electrode 4 and a p-type pad electrode 5 may collectively be referred to as a "p-type electrode region"). Upon one of the n-type GaN compound semiconductor layers, an n-type transmissive electrode 1 is formed around the circumference of the p-type transmissive electrode 4. An n-type pad electrode 3 is formed on the n-type transmissive electrode 1 (the n-type pad electrode 3 and the n-type transmissive electrode 1 may collectively be referred to as an "n-type electrode region"). No electrode is formed in a region 2.

Next, a method for producing the light emission device 1000 according to the present example will be specifically described with reference to FIGS. 8A to 8F.

Figure 8D:
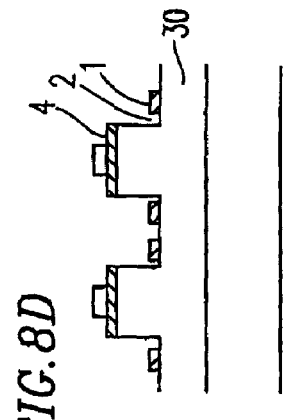
FIGS. 8A to 8F are schematic cross-sectional views respectively illustrating the GaN compound semiconductor light emission device 1000 according to Example 1 of the present invention, at various steps of a production process therefor.
Figure 8E:
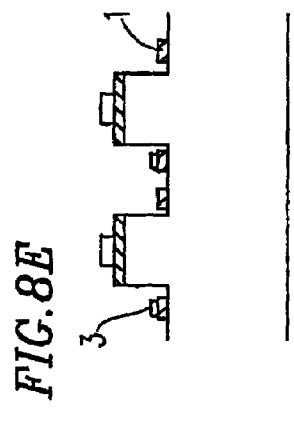
Figure 8F:
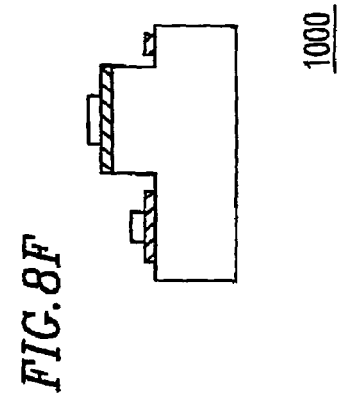
Figure 8A:
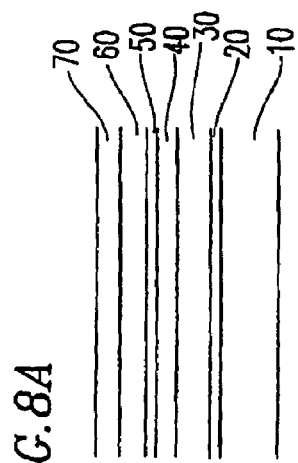

First, a GaN compound semiconductor multilayer structure is formed on a sapphire substrate 10 by using a metal organic chemical vapor deposition (MOCVD) technique, for example. The GaN compound semiconductor multilayer structure includes the following layers, which are laminated in this order: an AlN buffer layer 20, an n-type GaN compound semiconductor layer 30, an n-type GaN compound semiconductor cladding layer 40, a GaN compound semiconductor light emission layer 50, a p-type GaN compound semiconductor cladding layer 60, and a p-type GaN compound semiconductor contact layer 70 (FIG. 8A).

Figure 8B:
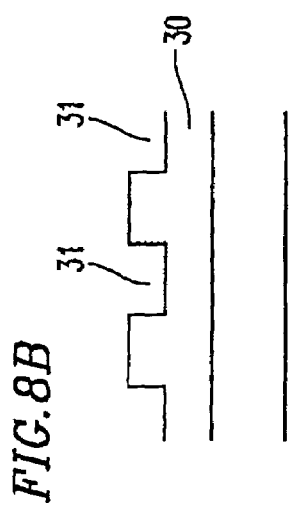

Next, the substrate 10 is removed from the MOCVD apparatus, and dry etching is performed so as to partially expose a surface 31 of the n-type GaN compound semiconductor layer 30 (FIG. 8B). A photoresist may be applied as an etching mask for the dry etching process.

Figure 8C:
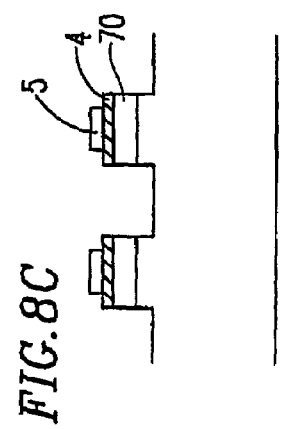

Next, the p-type transmissive electrode 4 (e.g., Ni) is formed so as to have a thickness of about 7 nm on substantially the entire surface of the p-type GaN compound semiconductor contact layer 70. Next, the p-type pad electrode 5 (e.g., Au) is formed so as to have a thickness of about 300 nm (FIG. 8C).

Next, on the exposed surface 31 of the n-type GaN compound semiconductor layer 30, the n-type transmissive electrode 1 (e.g., Ti) is formed so as to have a thickness of about 5 nm and a width of about 5 µm, such that the n-type transmissive electrode 1 is around the circumference of the p-type transmissive electrode 4. The non-electrode region 2 is provided in order to ensure that the n-type transmissive electrode 1 is not in contact with the p-type GaN compound semiconductor layers (i.e., the p-type GaN compound semiconductor cladding layer 60 and the p-type GaN compound semiconductor contact layer 70) and the p-type transmissive electrode 4 (FIG. 8D). Furthermore, the n-type pad electrode 3 (e.g., Al) is formed on the n-type transmissive electrode 1 so as to have a thickness of about 300 nm (FIG. 8E).

Next, the wafer is divided into a number of pieces, each measuring about 500 µm×500 µm, by a scribing or dicing technique. Thus, the GaN compound semiconductor light emission device is obtained in the form of a chip (FIG. 8F).

Figure 4:
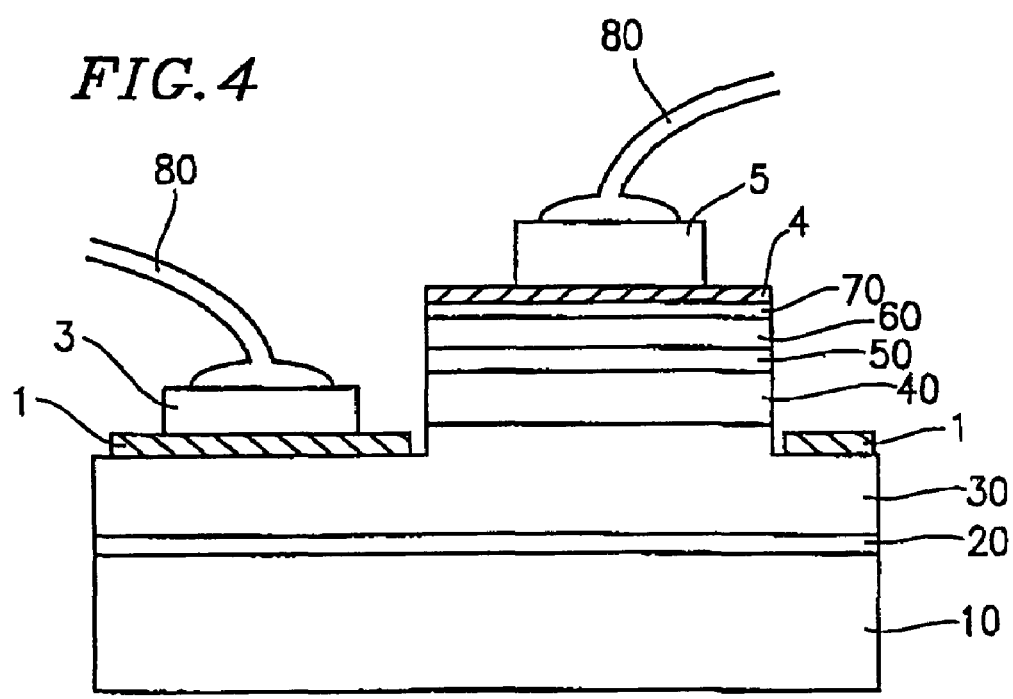
FIG. 4 is a schematic cross-sectional view illustrating the GaN compound semiconductor light emission device 1000 according to Example 1 of the present invention.

FIG. 4 shows a cross section of the GaN compound semiconductor light emission device thus produced. FIG. 4 also shows that Au wires 80 are formed so as to be coupled to the p-type pad electrode 5 and the n-type pad electrode 3. An external current can be supplied to the light emission device 1000 via the Au wires 80.

In the case where a forward current of about 20 mA is supplied to the light emission device according to the present example of the invention, a light output power of about 2 mW is obtained with a forward voltage of about 3.2 V.

An electron beam deposition method can be used for forming the metal electrodes. A well-known lift-off method can be used to shape the electrodes.

Although the n-type pad electrode 3 and the p-type pad electrode 5 are illustrated in circular shapes in FIG. 1, the n-type pad electrode 3 and the p-type pad electrode 5 may alternatively have square shapes.

The n-type transmissive electrode 1 is illustrated as being formed around the entire circumference of the p-type transmissive electrode 4 according to the present example. However, the n-type transmissive electrode 1 may be formed only in a partial region excluding the periphery of the p-type pad electrode 5, without compromising the emission characteristics. This is because the component of light which is emitted by injecting a current directly under the p-type pad electrode 5 will be shielded by the p-type pad electrode 5 any way, so that there is no need to provide the n-type transmissive electrode 1 around the periphery of the p-type pad electrode 5.

A component of light which is emitted by an active layer of a light emission device travels toward a substrate within the device, so as to be reflected therefrom and exit the device. In accordance with the light emission device according to the present invention, the transmissive n-electrode 1, which is formed in a peripheral portion of the face on which the p-type electrode 4 is provided (i.e., the face through which light is allowed to exit the light emission device), does not shield the light reflected by the substrate from exiting the device. Thus, the present invention avoids the problem of a decrease in the amount of light which is generated by the light emission device and/or a decrease in the total light output power obtained from the light emission device.

The n-type electrode according to the present invention is rendered substantially transparent with respect to the emitted light by being composed of a thin metal film, or of a conductive oxide semiconductor layer which is substantially transparent with respect to the emitted light.

EXAMPLE 2

Figure 2:
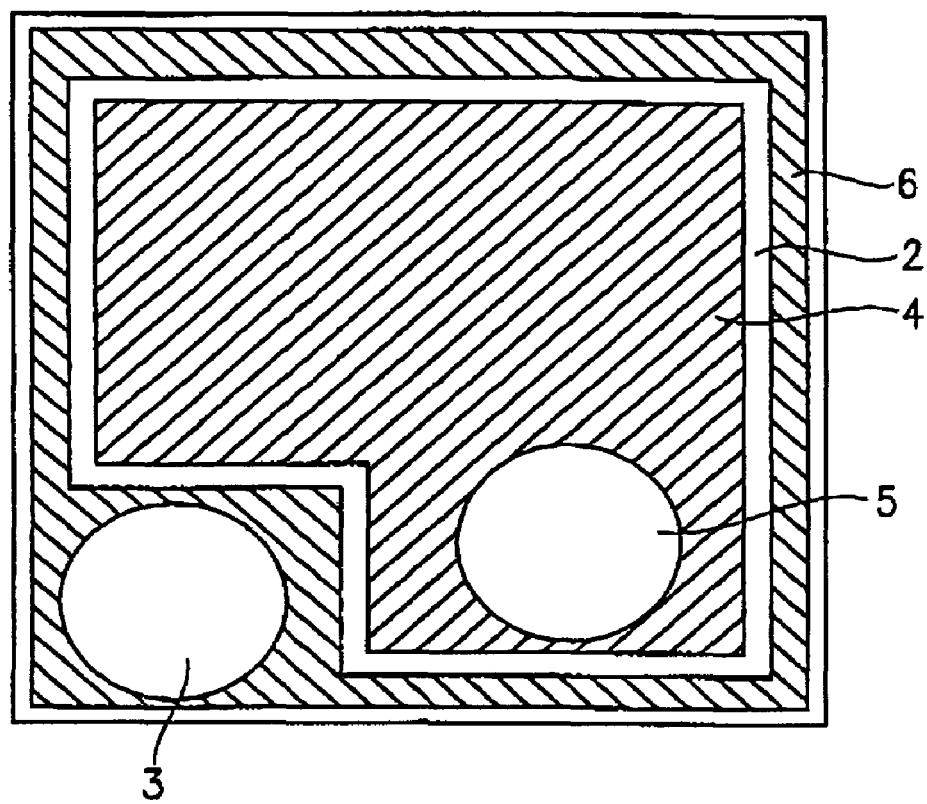
FIG. 2 is a schematic plan view illustrating a GaN compound semiconductor light emission device 2000 according to Example 2 of the present invention.

FIG. 2 is a schematic plan view illustrating a light emission device 2000 according to Example 2 of the present invention. The light emission device 2000 includes a GaN compound semiconductor multilayer structure including at least a light emission layer (active layer). The GaN compound semiconductor multilayer structure generally includes p-type GaN compound semiconductor layers and n-type GaN compound semiconductor layers. Upon one of the p-type GaN compound semiconductor layers, a p-type transmissive electrode 4 and a p-type pad electrode 5 are formed. Upon one of the n-type GaN compound semiconductor layers, an n-type transmissive electrode 6 is formed around the circumference of the p-type transmissive electrode 4. The n-type transmissive electrode 6 has a double-layer structure including a transmissive thin metal film and an oxide semiconductor layer. An n-type pad electrode 3 is formed on the n-type transmissive electrode 6.

The production method and construction of the GaN compound semiconductor multilayer structure can be the same as in Example 1. The n-type transmissive electrode 6 may be composed of a thin metal film (Ti) having a thickness of about 2 nm and a width of about 80 µm and an overlying ITO layer having a thickness of about 300 nm. It may be within conventional practice to employ a thin Ti layer for an improved transmittance, but this invites the risk of disruption of the Ti layer. According to the present example of the invention, however, the thick ITO layer formed on the thin Ti layer ensures electrical integrity, thereby preventing the problem of disruption associated with the use of the thin Ti layer. Since the ITO layer allows the use of a thin Ti layer, the n-type transmissive electrode 6 can attain an improved transmittance, which provides for an improved external emission efficiency.

In the case where a forward current of about 20 mA is supplied to the light emission device according to the present example of the invention, a light output power of about 3.5 mW is obtained with a forward voltage of about 3.3 V.

Although the n-type pad electrode 3 is formed on the n-type transmissive electrode 6 according to the present example of the invention, Au wires 80 can be formed directly on the n-type transmissive electrode 6, via which an external current can be supplied, without forming the n-type pad electrode 3 thereon. The production method can be thus simplified. Alternatively, the n-type transmissive electrode 6 may only be composed of an oxide semiconductor layer to further simplify the production method.

EXAMPLE 3

Figure 3:
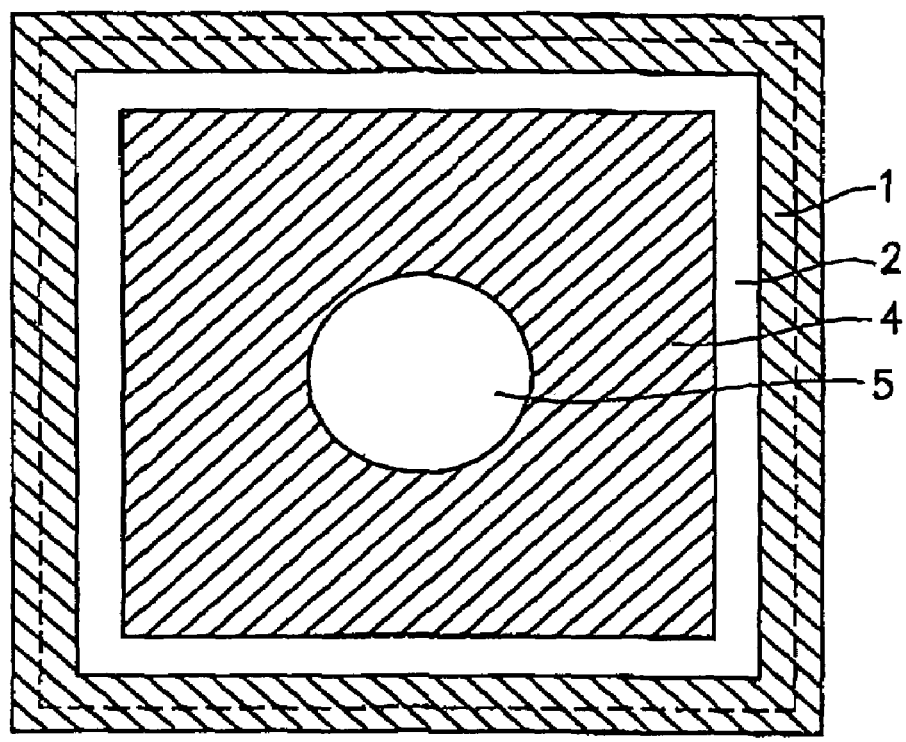
FIG. 3 is a schematic plan view illustrating a GaN compound semiconductor light emission device 3000 according to Example 3 of the present invention.

FIG. 3 is a schematic plan view illustrating a light emission device 3000 according to Example 3 of the present invention. The light emission device 3000 includes a GaN compound semiconductor multilayer structure including at least a light emission layer (active layer). The GaN compound semiconductor multilayer structure generally includes p-type GaN compound semiconductor layers and n-type GaN compound semiconductor layers. Upon one of the p-type GaN compound semiconductor layers, a p-type transmissive electrode 4 and a p-type pad electrode 5 are formed. An n-type transmissive electrode 1 is formed around the circumference of the p-type transmissive electrode 4. No electrode is formed in a region 2.

Next, a method for producing the light emission device 3000 according to the present example will be specifically described with reference to FIGS. 9A to 9E.

First, a GaN compound semiconductor multilayer structure is formed on a conductive GaN substrate 10 by using an MOCVD technique, for example. The GaN compound semiconductor multilayer structure includes the following layers, which are laminated in this order: a GaN buffer layer 20, an n-type GaN compound semiconductor layer 30, an n-type GaN compound semiconductor cladding layer 40, a GaN compound semiconductor light emission layer 50, a p-type GaN compound semiconductor cladding layer 60, and a p-type GaN compound semiconductor contact layer 70 (FIG. 9A).

Next, the substrate 10 is removed from the MOCVD apparatus, and dry etching is performed so as to partially expose a surface 31 of the n-type GaN compound semiconductor layer 30 (FIG. 9B). A photoresist may be applied as an etching mask for the dry etching process.

Next, the p-type transmissive electrode 4 (e.g., Ni) is formed so as to have a thickness of about 10 nm on substantially the entire surface of the p-type GaN compound semiconductor contact layer 70. Next, the p-type pad electrode 5 (e.g., Au) is formed so as to have a thickness of about 300 nm. Next, on the exposed surface 31 of the n-type GaN compound semiconductor layer 30, the n-type transmissive electrode 1 (e.g., Ti) is formed so as to have a thickness of about 5 nm and a width of about 5 $\mu$m, such that the n-type transmissive electrode 1 is around the circumference of the p-type transmissive electrode 4. The non-electrode region 2 is provided in order to ensure that the n-type transmissive electrode 1 is not in contact with the p-type GaN compound semiconductor layers (i.e., the p-type GaN compound semiconductor cladding layer 60 and the p-type GaN compound semiconductor contact layer 70) and the p-type transmissive electrode 4 (FIG. 9C).

Next, the wafer is divided into a number of chips, each measuring about 500 $\mu$m×500 $\mu$m, by a scribing or dicing technique. Then, the n-type transmissive electrode 1 (e.g., Ti) is formed on the lower face and side faces of the substrate 10, as well as on the side faces of the GaN buffer layer 20 and the n-type GaN compound semiconductor layer 30, so as to have a thickness of about 5 nm on the side faces (FIG. 9D).

Furthermore, an n-type pad electrode 7 (e.g., Al) is formed on the n-type transmissive substrate 1 so as to have a thickness of about 300 nm (FIG. 9E).

Figure 5:
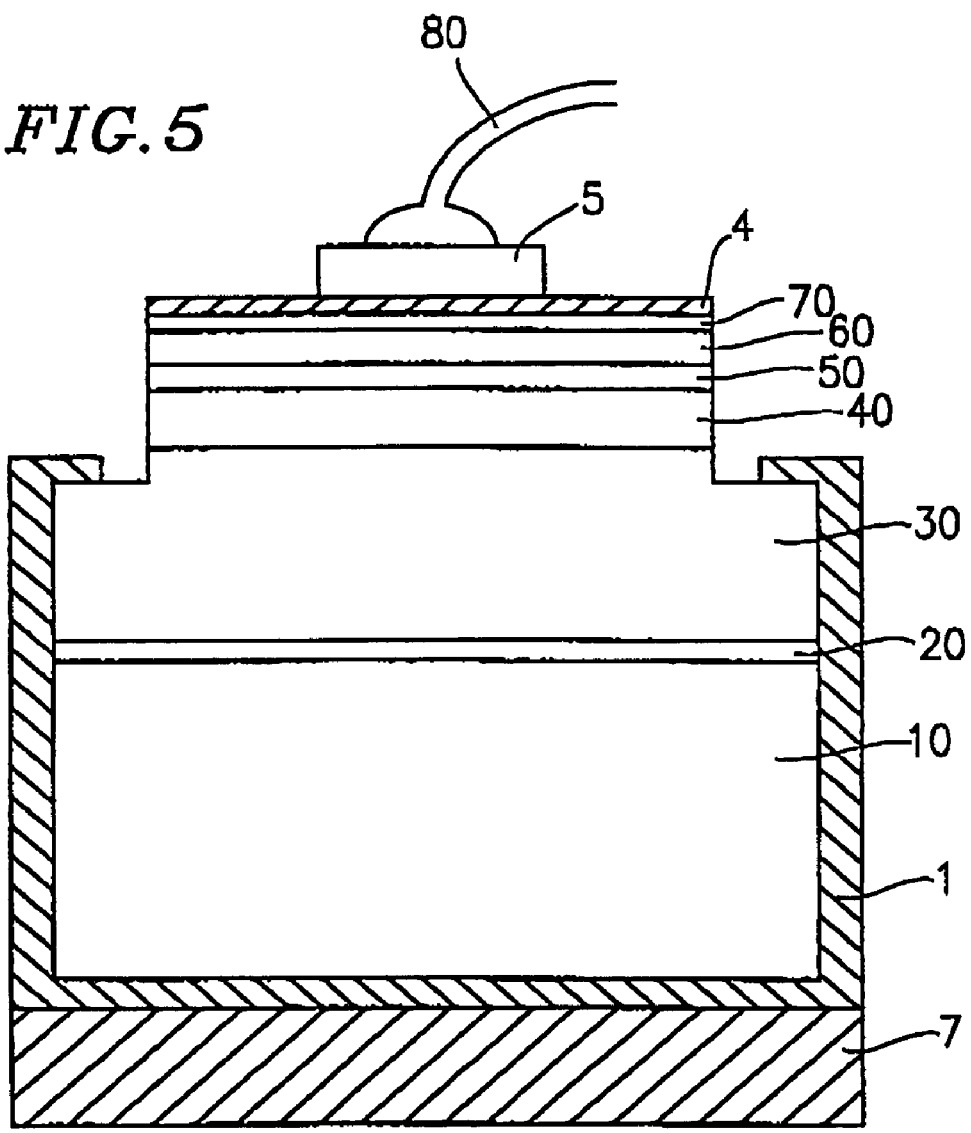
FIG. 5 is a schematic cross-sectional view illustrating the GaN compound semiconductor light emission device 3000 according to Example 3 of the present invention.

FIG. 5 shows a cross section of the GaN compound semiconductor light emission device thus produced. FIG. 5 also shows that an Au wire 80 is coupled to the p-type pad electrode 5, and that the n-type pad electrode 7 is placed at the cup-shaped bottom of a lead frame (not shown) with Ag paste or the like for electrical connection. Thus, an external current can be supplied to the light emission device 3000.

In the case where a forward current of about 20 mA is supplied to the light emission device according to the present example of the invention, a light output power of about 2 mW is obtained with a forward voltage of about 3.2 V.

A conventional light emission device structure incorporating a conductive substrate is known in which an electrode is formed on the conductive substrate so that a current can be supplied via an electrode formed on the opposite side from the substrate. When forming a GaN compound semiconductor multilayer structure on the substrate in such a light emission device, a buffer layer composed of an identical or non-identical material to the conductive substrate is formed as a layer immediately above the substrate. Although this structure makes for ease of mounting, such a buffer layer has a defective level and/or high resistance, and therefore has an unstable and low crystallinity level. Therefore, when a current is flowed through the buffer layer, the current may be trapped at the defective level, or may be hindered due to the high resistance. This results in problems such as an increased forward voltage and/or a non-uniform current flow, leading to low reliability. Such problems can be forestalled by adopting the structure according to the present example of the invention because a current injected thereto does not flow through a buffer layer.

In accordance with the light emission device of the present invention, the n-type transmissive electrode 1 is formed on the lower face and side faces of the substrate 10, as well as on the side faces of the layers laminated upon the substrate 10 (i.e., the GaN buffer layer 20 and the n-type GaN compound semiconductor layer 30). Furthermore, the n-type electrode which is rendered substantially transparent with respect to the emitted light by being composed of a thin metal film, or of a conductive oxide semiconductor layer which is substantially transparent with respect to the emitted light, so that the n-type electrode does not shield the emitted light. Thus, the generated light which travels toward the substrate 10 is efficiently emitted through the transmissive n-type electrode. Therefore, according to the present invention, a highly reliable GaN compound semiconductor light emission device can be provided, in which increase in the forward voltage is avoided.

Since a conductive substrate is employed as the substrate 10, the n-type transmissive electrode 1 does not need to be formed on the entire side faces of the substrate, so long as a current supplied via the n-type pad electrode 7 can flow through the conductive substrate and through the n-type transmissive electrode 1 formed in contact with the buffer layer 20, so as to be uniformly injected into the n-type GaN compound semiconductor layer 30. The n-type transmissive electrode 1 may only be formed on selected portions of the side faces of the substrate 10. An electron beam deposition method can be used for forming the metal electrodes. A well-known lift-off method can be used to shape the electrodes.

EXAMPLE 4

Figure 6:
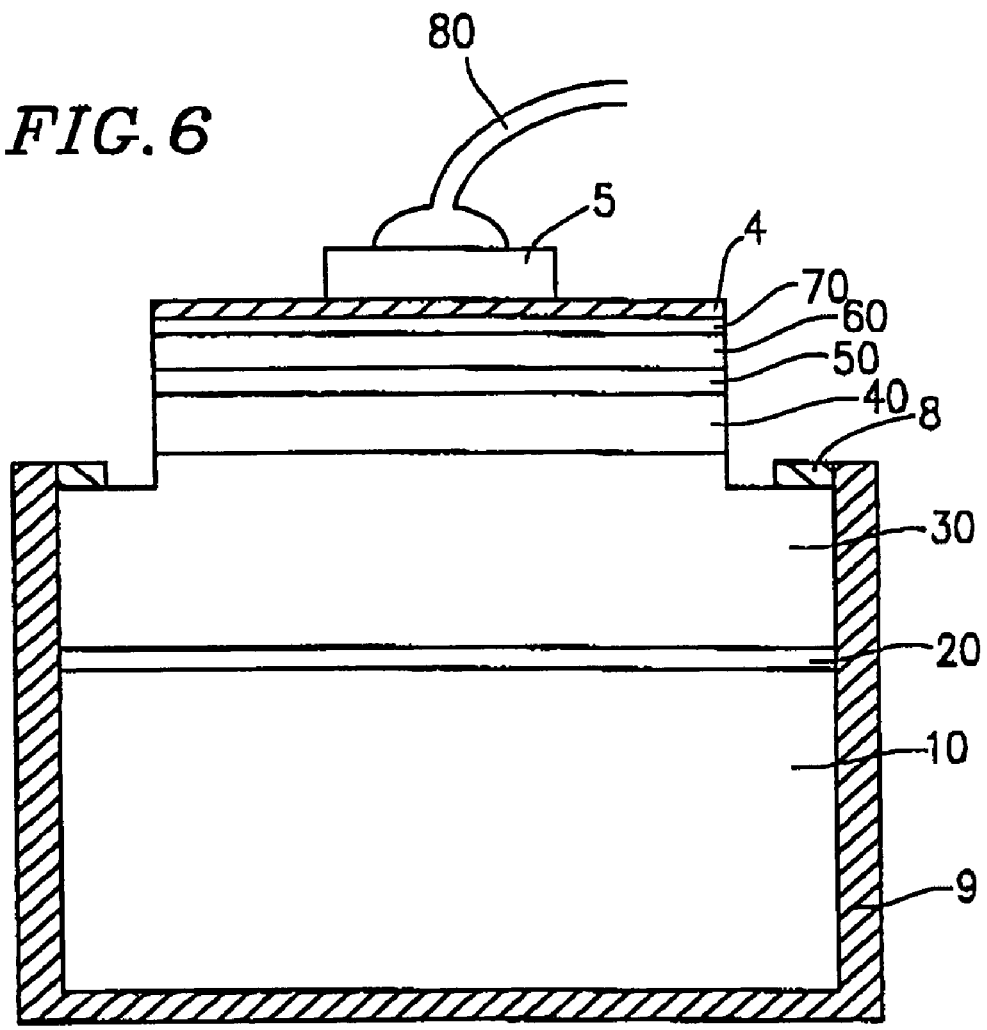
FIG. 6 is a schematic cross-sectional view illustrating a GaN compound semiconductor light emission device 4000 according to Example 4 of the present invention.

FIG. 6 is a schematic cross-sectional view illustrating a light emission device 4000 according to Example 4 of the present invention. The light emission device 4000 includes a GaN compound semiconductor multilayer structure including at least a light emission layer (active layer). The GaN compound semiconductor multilayer structure is formed on a conductive substrate. Upon a p-type GaN compound semiconductor contact layer 70, a p-type transmissive electrode 4 and a p-type pad electrode 5 are formed. As an n-type transmissive electrode, a thin metal transmissive electrode 8 and an oxide semiconductor layer 9 are provided. An Au wire 80 is coupled to the p-type pad electrode 5. Another Au wire (not shown) is placed at the cup-shaped bottom of a lead frame (not shown), and electrically connected to the oxide semiconductor layer 9 via Ag paste or the like. Thus, an external current can be supplied to the light emission device 4000.

The production method and construction of the GaN compound semiconductor multilayer structure can be the same as in Example 3. As the thin metal film transmissive electrode 8, Ti is formed around the circumference of the p-type transmissive electrode 4 so as to have a thickness of about 2 nm. As the oxide semiconductor layer 9, ITO is formed on the lower face and side faces of the substrate 10, as well as on the side faces of the buffer layer 20 and the n-type GaN compound semiconductor layer 30 so as to have a thickness of about 300 nm. Due to its high transmittance, the ITO layer 9 formed on the lower face and side faces of the substrate 10 allows the generated light to pass through to the substrate 10, which can be efficiently emitted to the external space of the light emission device. As a result, the external emission efficiency can be further improved as compared to Example 3.

In the case where a forward current of about 20 mA is supplied to the light emission device according to the present example of the invention, a light output power of about 4 mW is obtained with a forward voltage of about 3.3 V.

Figure 7:
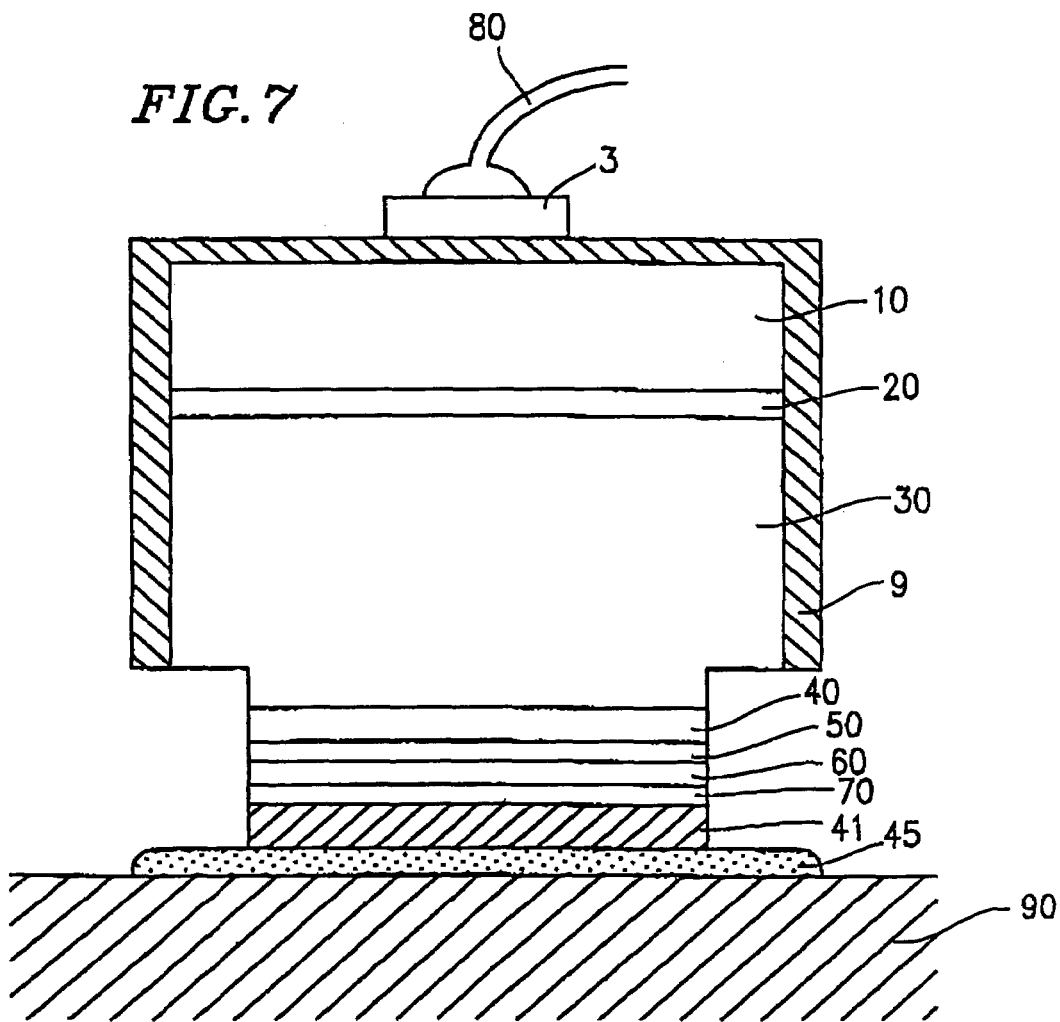
FIG. 7 is a schematic cross-sectional view illustrating a variant of the GaN compound semiconductor light emission device according to Example 4 of the present invention.

FIG. 7 is a schematic cross-sectional view illustrating a variant of Example 4 of the present invention. This light emission device includes a GaN compound semiconductor multilayer structure including at least a light emission layer (active layer). Upon a p-type GaN compound semiconductor contact layer 70, a p-type thick film electrode 41, including an Ni layer which is about 7 nm thick and an Au layer which is about 1 to 10 μm thick, is formed. An oxide semiconductor layer 9, composed of ITO, is provided so as to have a thickness of about 100 nm on the side faces of the n-type GaN compound semiconductor layer 30 and the buffer layer 20, as well as on the side faces and the lower face of the substrate 10. Due to its high transmittance, the ITO layer 9 formed on the lower face and side faces of the substrate 10 allows the generated light to pass through to the substrate 10, which can be efficiently emitted to the external space of the light emission device. As a result, the external emission efficiency can be further improved as compared to Example 3. An n-type pad electrode 3 is formed on the oxide semiconductor layer 9, and an Au wire 80 is coupled to the n-type pad electrode 3. The p-type thick film electrode 41 is placed at the cup-shaped bottom 90 of a lead frame. The p-type thick film electrode 41 is electrically connected to the cup-shaped bottom 90 via a thin In film 45 or the like. Thus, an external current can be supplied to this light emission device.

Since this light emission device is mounted in such a manner that the multilayer structure faces the cup-shaped bottom 90, a light output power saturation does not occur even with a forward current of about 100 mA. In the case where a forward current of about 20 mA is supplied to this light emission device, a light output power of about 6 mW is obtained with a forward voltage of about 3.4 V.

It is not necessary to form the n-type pad electrode 3 on the oxide semiconductor layer 9. The Au wire 80 can be coupled directly to the n-type oxide semiconductor layer 9. The production method can be thus simplified.

EXAMPLE 5

Figure 11:
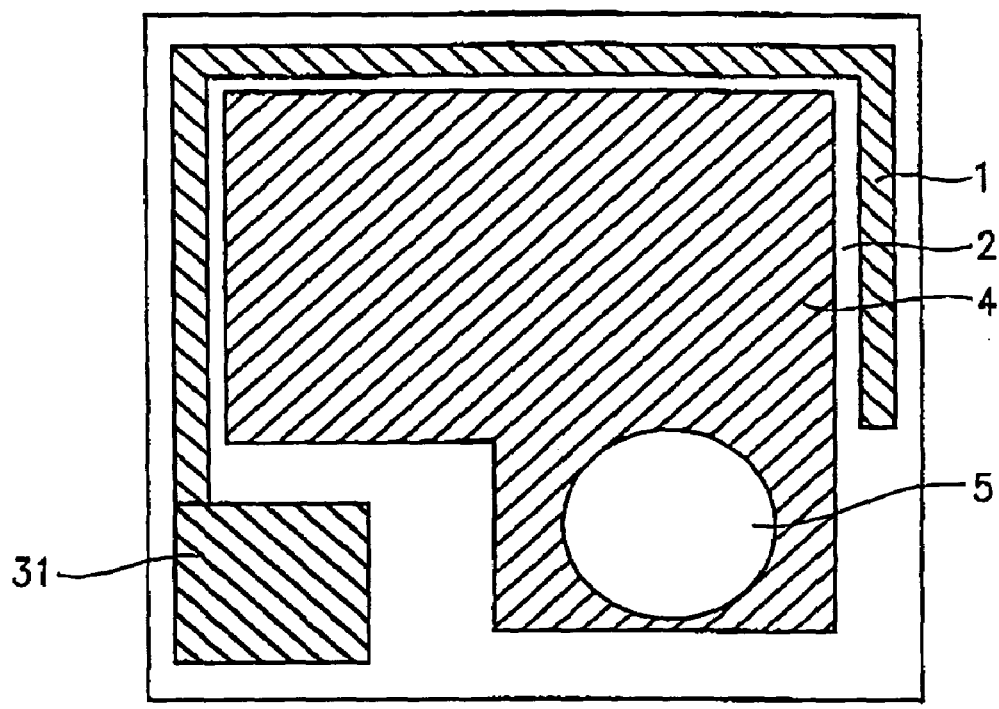
FIG. 11 is a schematic plan view illustrating a GaN compound semiconductor light emission device 5000 according to Example 5 of the present invention.

FIG. 11 Is a schematic plan view illustrating a light emission device 5000 according to Example 5 of the present invention. The light emission device 5000 includes a GaN compound semiconductor multilayer structure including at least a light emission layer (active layer). The GaN compound semiconductor multilayer structure generally includes p-type GaN compound semiconductor layers and n-type GaN compound semiconductor layers. Upon one of the p-type GaN compound semiconductor layers, a p-type transmissive electrode 4 and a p-type pad electrode 5 are formed. Upon one of the n-type GaN compound semiconductor layers, a thin metal film is formed, as an n-type transmissive electrode 1, partially around the circumference of the p-type transmissive electrode 4. An n-type pad electrode 31 is formed on the n-type transmissive electrode 1.

The production method and construction of the GaN compound semiconductor multilayer structure can be the same as in Example 1. As the n-type transmissive electrode 1, a thin metal film (e.g., Ti) is formed so as to have a thickness of about 3 nm and a width of about 7 μm, upon which an Al layer is formed so as to have a thickness of about 4 nm. Next, as the n-type pad electrode 31, a Pd layer having a thickness of about 30 nm and an Au layer having a thickness of about 400 nm are formed. As the p-type transmissive electrode 4, a Pd layer is formed so as to have a thickness of about 4 nm. As the p-type pad electrode 5 on the p-type transmissive electrode 4, a Pd layer having a thickness of about 30 nm and an Au layer having a thickness of about 400 nm are formed. Both the n-type pad electrode 31 and the p-type pad electrode 5 are provided substantially along one side of the chip. Since the n-type transmissive electrode 1 is not formed in the neighborhood of the p-type pad electrode 5, a uniform emission pattern can be provided. If the n-type transmissive electrode is formed in the neighborhood of the p-type pad electrode 5, there will be stronger emission in the neighborhood of the p-type pad electrode 5, resulting in a somewhat non-uniform emission pattern. Since the n-type transmissive electrode 1 is not formed in the neighborhood of the p-type pad electrode 5, and since Pd and Au used for the n-type pad electrode 31 creates a Schottky contact with the adjoining n-type gallium nitride compound semiconductor layer, an externally injected current Is conducted through the n-type pad electrode 31 composed of Pd and Au, into the n-type transmissive electrode 1 formed partially around the circumference of the p-type transmissive electrode 4.

Suitable materials to be used for the n-type pad electrode 31 to create a Schottky contact include Ni/Au, Pd/Ni/Au, Pd/Al, Ni/Al, Pd/Ni/Al. Pd/ITO, Ni/ITO, Pt/ITO, and the like.

The light emission device according to the present invention provides an emission pattern with enhanced uniformity. In the case where a forward current of about 20 mA is supplied to the light emission device according to the present example of the invention, a light output power of about 3.0 mW is obtained with a forward voltage of about 3.3 V.

By employing Au also as the uppermost layer of not only the p-type pad electrode 5 but also the n-type pad electrode 31, wire-bonding can be facilitated. The use of the same material for both the p-type pad electrode 5 and the n-type pad electrode 31 also makes for a more stable and more productive production method.

EXAMPLE 6

Figure 12:
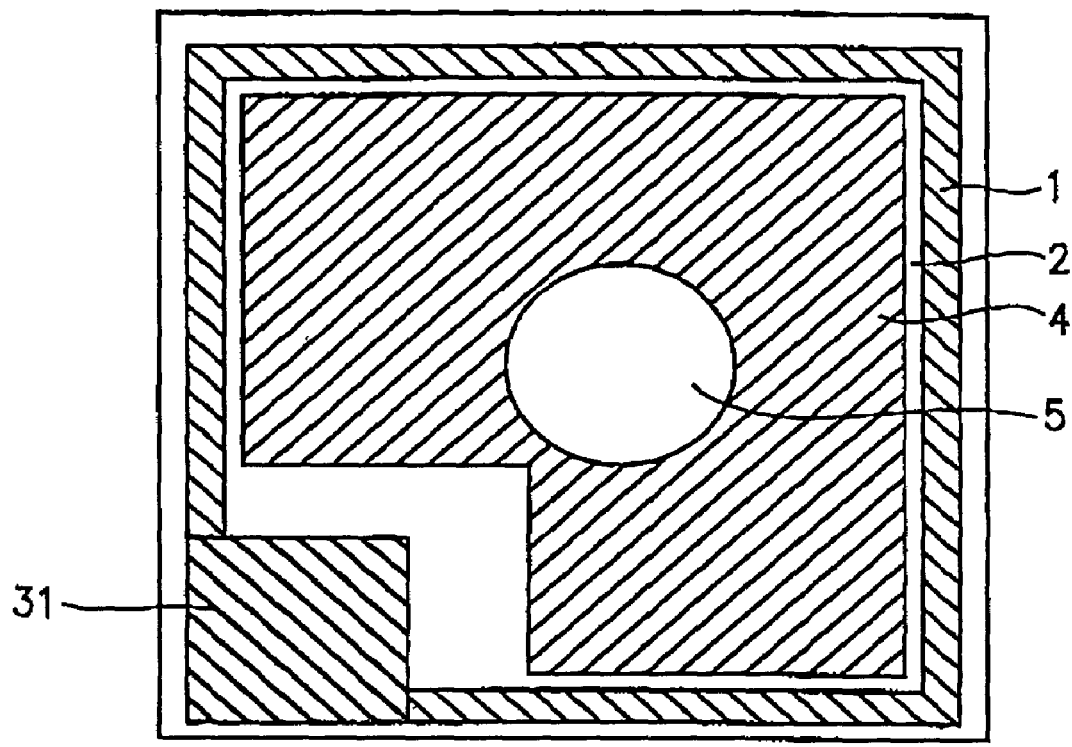
FIG. 12 is a schematic plan view illustrating a GaN compound semiconductor light emission device 6000 according to Example 6 of the present invention.
Figure 13:
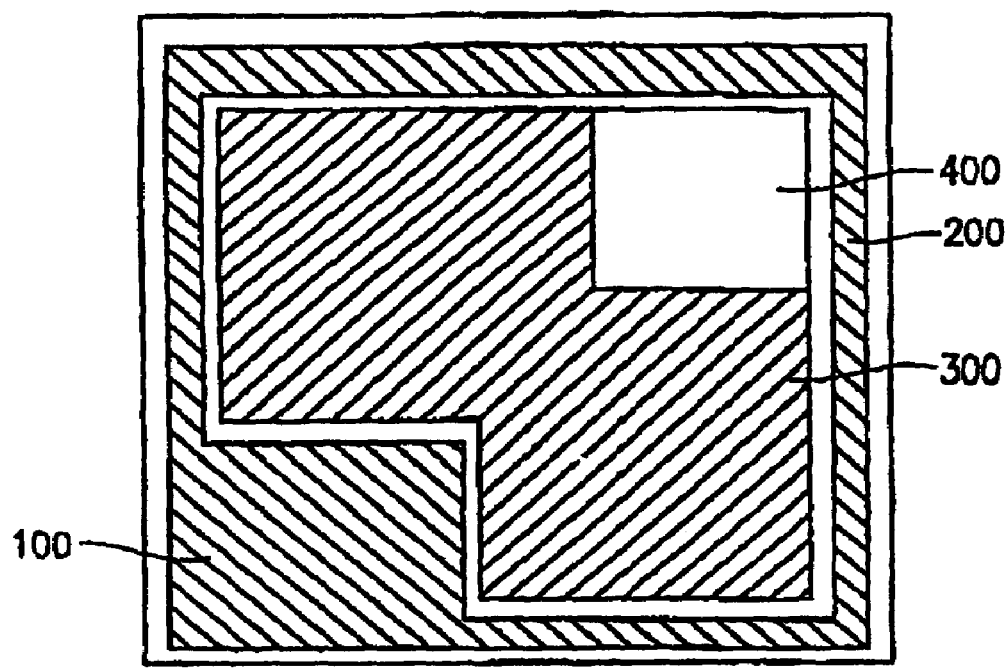
FIG. 13 is a schematic plan view illustrating a conventional GaN compound semiconductor light emission device.

FIG. 12 is a schematic plan view illustrating a light emission device 6000 according to Example 6 of the present invention. The light emission device 6000 includes a GaN compound semiconductor multilayer structure including at least a light emission layer (active layer). The GaN compound semiconductor multilayer structure generally includes p-type GaN compound semiconductor layers and n-type GaN compound semiconductor layers. Upon one of the p-type GaN compound semiconductor layers, a p-type transmissive electrode 4 and a p-type pad electrode 5 are formed. Upon one of the n-type GaN compound semiconductor layers, an n-type transmissive electrode 6 is formed around the circumference of the p-type transmissive electrode 4. An n-type pad electrode 31 is formed on the n-type transmissive electrode 6. The p-type pad electrode 5 is formed in an equidistant manner with respect to the n-type transmissive electrode 6. By forming the n-type pad electrode 31 by using Pd, Ni, and Au, a Schottky contact is created with the adjoining n-type gallium nitride compound semiconductor layer. As a result, an externally injected current is conducted through the n-type pad electrode 31 composed of Pd, Ni, and Au, so to be uniformly injected into the device from the n-type transmissive electrode 1 formed around the circumference of the p-type transmissive electrode 4.

The production method and construction of the GaN compound semiconductor multilayer structure can be the same as in Example 1. As the n-type transmissive electrode 6, a thin metal film (e.g., Ti) is formed so as to have a thickness of about 30 nm and a width of about 40 μm, upon which an ITO layer is formed so as to have a thickness of about 150 nm. Next, as the n-type pad electrode 31, a Pd layer having a thickness of about 20 nm, an Ni layer having a thickness of about 30 nm, and an Au layer having a thickness of about 400 nm are formed. As the p-type pad electrode 5 on the p-type transmissive electrode 4, a Pd layer having a thickness of about 20 nm, an Ni layer having a thickness of about 30 nm, and an Au layer having a thickness of about 400 nm are formed. If the n-type transmissive electrode 6 is formed in the neighborhood of the p-type pad electrode 5, the resultant emission pattern will have some non-uniformity in the neighborhood of the p-type pad electrode 5. Forming the p-type pad electrode 5 in an equidistant manner with respect to the n-type transmissive electrode 6 can provide improved uniformity in the resultant emission pattern.

Suitable materials to be used for the n-type pad electrode 31 to create a Schottky contact include Ni/Au, Pd/Ni/Au, Pd/Al, Ni/Al, Pd/Ni/Al, and the like. Suitable materials to be used for the p-type pad electrode 5 include Pt/Au, Pd/Au, Ni/Au, Pd/ITO, Ni/ITO, Pt/ITO, and the like. By employing ITO or the like as the uppermost layer of the p-type pad electrode 5, the emitted light is prevented from being shielded thereby, so that a further improvement in the external emission efficiency can be provided.

Figure 10:
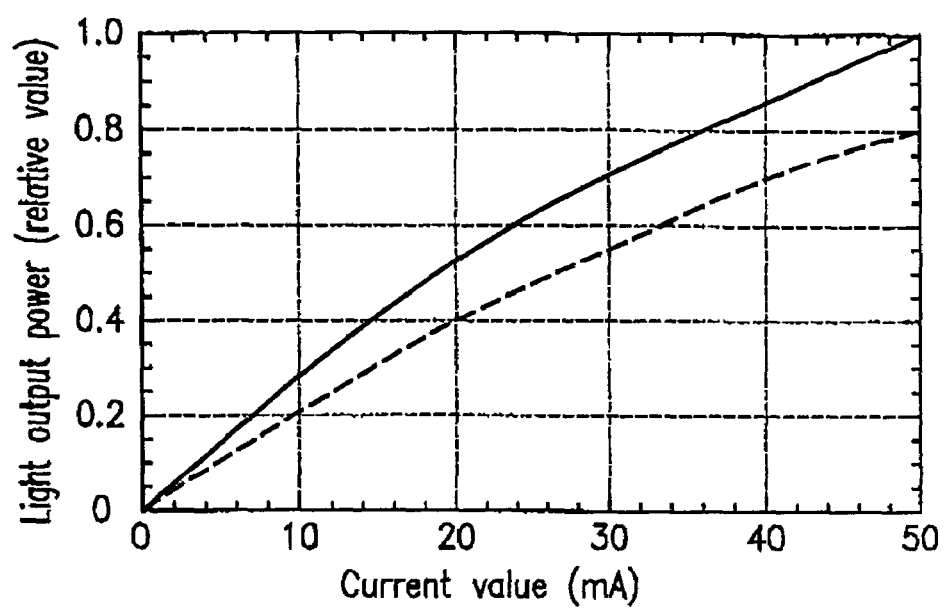
FIG. 10 illustrates the light output power provided by a light emission device produced according to the present example of the invention (solid line), as compared to the light output power provided by a conventional light emission device (broken line).

The light emission device according to the present invention provides an emission pattern with enhanced uniformity. In the case where a forward current of about 20 mA is supplied to the light emission device according to the present example of the invention, a light output power of about 3 mW is obtained with a forward voltage of about 3.1 V. FIG. 10 illustrates the light output power provided by a light emission device produced according to the present example of the invention (solid line), as compared to the light output power provided by a conventional light emission device (broken line). By employing a thin film for the n-type peripheral electrode, the light emission device according to the present invention provides an external emission efficiency which is about 25% improved from that of the conventional light emission device, in the case where an about 20 mA current is supplied. According to Examples 5 and 6 of the present invention, a more uniform emission pattern can be provided together with a high external emission efficiency.

According to the present invention, there is provided a light emission device, incorporating an n-type electrode which is formed either in a peripheral portion of a face on which a p-type electrode is provided or on the lower face and the side faces of a substrate. The n-type electrode may be a thin metal film or an oxide semiconductor layer, of a type which is substantially transparent with respect to light emitted from the light emission device and which creates an ohmic contact, or a multilayer structure including both. The light emission device according to the present invention provides for improved external emission efficiency, a reduced forward voltage, and high reliability.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A gallium nitride compound semiconductor light-emitting diode comprising:
    a substrate;
    an n-type electrode region comprising an n-type transmissive electrode;
    a gallium nitride compound semiconductor multilayer structure including an active layer; and
    a p-type electrode region comprising a p-type transmissive electrode, wherein
    the n-type transmissive electrode and p-type transmissive electrode are substantially transparent, and
    the p-type transmissive electrode and the n-type transmissive electrode transmit light which is generated in the active layer and reflected from the substrate so that light exits the light emission device.

2. A gallium nitride compound light-emitting diode according to claim 1, wherein the n-type transmissive electrode is located outside of the p-type transmissive electrode.

3. A gallium nitride compound semiconductor light-emitting diode according to claim 1, wherein the n-type transmissive electrode is formed at least partially around a circumference of the p-type transmissive electrode.

4. A gallium nitride compound light-emitting diode according to claim 1,
    wherein the gallium nitride compound semiconductor multilayer structure includes a buffer layer and an n-type gallium nitride compound semiconductor layer, and
    wherein the n-type transmissive electrode is formed on a side face of the substrate, a side face of the buffer layer, and a side face of the n-type gallium nitride compound semiconductor layer in a region neighboring the buffer layer.

5. A gallium nitride compound semiconductor light-emitting diode according to claim 1, wherein the n-type electrode region further comprises an n-type pad electrode, and
    wherein the p-type electrode region further comprises a p-type pad electrode.

6. A gallium nitride compound light-emitting diode according to claim 5, wherein the n-type pad electrode and the p-type pad electrode are provided substantially along one side of a light emitting face of the gallium nitride compound semiconductor light emission device.

7. A gallium nitride compound light-emitting diode according to claim 5, wherein the p-type pad electrode is formed in the vicinity of a center of a light emitting face of the gallium nitride compound semiconductor light emission device.

8. A gallium nitride compound light-emitting diode according to claim 1, wherein the n-type transmissive electrode comprises a thin metal film.

9. A gallium nitride compound light-emitting diode according to claim 5, wherein the n-type pad electrode is of a type which realizes a Schottky contact.

10. A gallium nitride compound semiconductor light-emitting diode according to claim 5, wherein the n-type pad electrode comprises at least one material selected from the group consisting of:

Pd/Au, Ni/Au, Pt/Au, Pd/Ni/Au, Pd/Al, Ni/Al, Pt/Al, and Pd/Ni/Al or an alloy comprising one or more materials selected from the above group.

11. A gallium nitride compound semiconductor light-emitting diode according to claim 3, wherein the n-type transmissive electrode is formed completely around the circumference of the p-type transmissive electrode.

12. A gallium nitride compound semiconductor light-emitting diode according to claim 1, wherein the n-type transmissive electrode and p-type transmissive electrode are of a thickness of 30 nm or less.

13. A gallium nitride compound semiconductor light-emitting diode comprising:

a substrate;

an n-type electrode region comprising an n-type transmissive electrode;

a gallium nitride compound semiconductor multilayer structure including an active layer; and a p-type electrode region comprising a p-type transmissive electrode, wherein the n-type transmissive electrode and p-type transmissive electrode are films so as to be substantially transparent, wherein the n-type transmissive electrode comprises a thick film of ITO, and the p-type transmissive electrode and the n-type transmissive electrode transmit light which is generated in the active layer and reflected from the substrate so that light exits the light emission device.

* * * * *